(12) United States Patent
Boland et al.

(10) Patent No.: US 6,943,417 B2
(45) Date of Patent: Sep. 13, 2005

(54) DNA-BASED MEMORY DEVICE AND METHOD OF READING AND WRITING SAME

(75) Inventors: Thomas Boland, Suwanee, GA (US); Thomas E. Wagner, Greer, SC (US)

(73) Assignee: Clemson University, Clemson, SC (US)

( * ) Notice: Subject to any disclaimer, the term of this patent is extended or adjusted under 35 U.S.C. 154(b) by 45 days.

(21) Appl. No.: 10/427,691

(22) Filed: May 1, 2003

(65) Prior Publication Data

US 2004/0217345 A1 Nov. 4, 2004

(51) Int. Cl.[7] .............................................. H01L 27/10
(52) U.S. Cl. ........................................ 257/414; 257/40
(58) Field of Search .................................. 257/414, 40

(56) References Cited

U.S. PATENT DOCUMENTS

| | | | |
|---|---|---|---|
| 5,491,097 A | * 2/1996 | Ribi et al. | 436/518 |
| 5,623,440 A | 4/1997 | Saito | |
| 5,730,940 A | * 3/1998 | Nakagawa | 422/68.1 |
| 5,807,758 A | 9/1998 | Lee et al. | |
| 5,958,701 A | 9/1999 | Green et al. | |
| 5,992,226 A | 11/1999 | Green et al. | |
| 6,086,821 A | 7/2000 | Lee | |
| 6,180,418 B1 | 1/2001 | Lee | |
| 6,218,086 B1 | 4/2001 | Binnig et al. | |
| 6,249,747 B1 | 6/2001 | Binnig et al. | |
| 6,303,316 B1 | * 10/2001 | Kiel et al. | 435/6 |
| 6,519,221 B1 | 2/2003 | Manalis et al. | |
| 6,569,382 B1 | * 5/2003 | Edman et al. | 422/68.1 |
| 2003/0002335 A1 | 1/2003 | Kwon | |
| 2004/0114445 A1 | * 6/2004 | Occhipinti et al. | 365/202 |

FOREIGN PATENT DOCUMENTS

WO     WO 0220179 A2     3/2002

OTHER PUBLICATIONS

Article—The *"Millipede"–More than one thousand tips for future AFM data storage.*
P. Vettiger, et al., IBM J. Res. Develop., vol. 44, No. 3, May 2000, pp. 323–340.
Article—*Backbone Modification of Nucleic Acids: Synthesis, Structure and Therapeutic Applications*, Jason Micklefield, Current Medicinal Chemistry, vol. 8, No. 10, 2001, pp. 1157–1179.

* cited by examiner

*Primary Examiner*—Jerome Jackson
(74) *Attorney, Agent, or Firm*—Dority & Manning, P.A.

(57) ABSTRACT

The present invention is directed to a memory device having very high storage density capability. In general, the memory device includes an array of individual memory cells which store information that is assigned a value based on the molecular contents of the memory cell. In a preferred embodiment, the molecules utilized for storing information in the memory cells may be single-strand polynucleotides, for instance single-strand oligonucleotides of between about 5 and about 20 monomer units. The present invention is also directed to methods and systems useful for writing and reading the molecular-based memory devices. In particular, the devices may be written and read via modified atomic force microscopy processes.

23 Claims, 14 Drawing Sheets

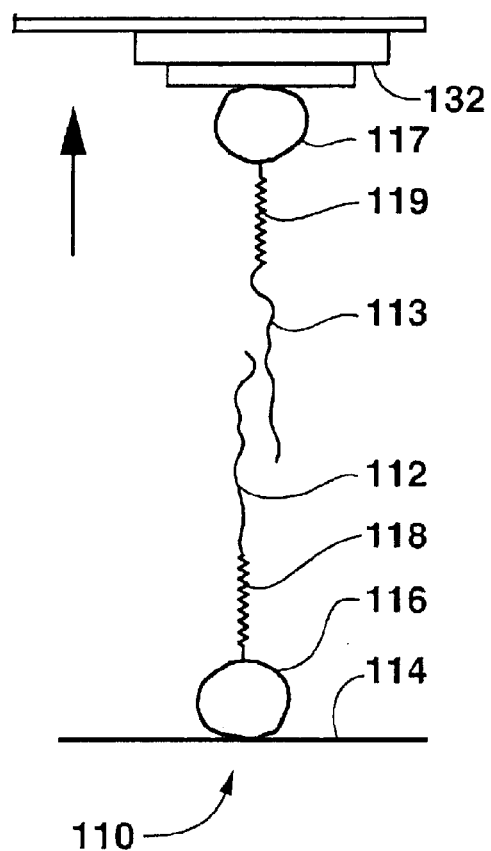 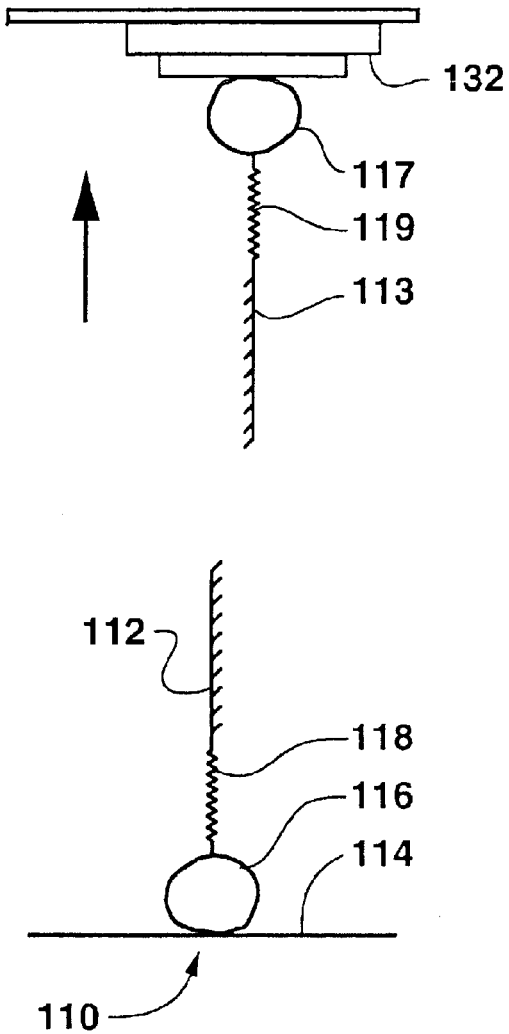
FIG. 4F  FIG. 4G

DNA-BASED MEMORY DEVICE AND METHOD OF READING AND WRITING SAME

BACKGROUND OF THE INVENTION

Every new generation of computer memory design provides increased information storage density. The typical structure size for a single binary storage cell has become quite small, on the order of about 0.5 $\mu$m per single cell, for instance. The physical limit to continued reduction in size of the structures which form electronics-based memory cells is rapidly being approached, however, and alternative methods for increasing the density of information stored in memory devices are being sought.

One method being developed to increase memory storage density is the construction of multi-bit memory cells (See, for example, U.S. Pat. No. 5,623,440 to Saito). The multi-bit memory cells of Saito are generally of the same basic construction as single-bit memory cells, consisting of a storage capacitor and a cell gate. The primary difference between the two is that the multi-bit memory cell can be used to store a plurality of bits through division of the voltage range of the cell into recognizable sub-ranges. For instance, in an electronic memory cell that is capable of storing voltage between 0 and 4 volts, the voltage range may be divided into four recognizable sub-ranges, and the memory cell can be a two-bit cell, rather than a single bit cell. In this manner, n bits may be stored in a single memory cell by creating $2^n$ voltage sub-ranges.

Problems have been encountered in the development of multi-bit memory cells, however. For instance, electronic noise has been an on-going developmental problem. The more sub-ranges created in a memory cell, the smaller the voltage separation between sub-ranges, and a relatively small amount of electronic noise can alter the data. Another problem encountered in electronic multi-bit memory cell development has been that of limitation of the voltage range possible in these extremely small circuits. For instance, development of an actual dynamic range of a memory cell beyond about 3.5 volts has proven very difficult. Additionally, physical size constraints of the cells are still a problem, for even when a multi-bit cell can be developed, it is still limited in size by the physical limitations of the electronic structures which must be created on the chip surface.

Another method currently being developed for increasing the information storage density of memory devices includes using the tip of an atomic force microscope (AFM) for reading and writing topographic features on a substrate surface. In these devices, the data can be written on a substrate via thermomechanical processes wherein the surface of a substrate is deformed using nanolithography processes and a value is assigned to a memory cell based on the presence or absence of deformity in the cell. (See, for example U.S. Pat. No. 6,249,747 to Binnig, et al.). These methods, however, are limited to binary systems, and the width of an individual memory cell will correspond at least to the diameter of the AFM tip.

Nature has provided the premier information storage system in terms of both efficiency and effectiveness in DNA (deoxyribose nucleic acid) molecules, which are the basis of the genetic system of living organisms. For instance, a DNA molecule only 100 monomer units in length, using only four different nucleotides, can encode $4^{100}$ bits of information in a linear distance of about 100 nanometers. Moreover, these $4^{100}$ molecular bits, when combined together, may encode more than $10^{50}$ gigabytes of information.

While attempts have been made to artificially replicate this system, the problems encountered in the attempts have been many. For instance, while natural enzymes may recognize an individual monomer unit of a DNA strand, no artificial system developed to date can mimic this level of sensitivity. In addition, construction of an individual strand of DNA is only possible through very complex and time consuming enzymatic or chemical means. Even in nature, DNA polymer construction is not spontaneous; only with another DNA template to use as a guide can new DNA be constructed. Thus, even in nature, information in DNA may only be copied, and not created.

As such, what is needed in the art is a memory device which can include extremely small individual memory cells, for instance memory cells on the order of nanometers rather that micrometers. In addition, what is needed in the art is a memory device which is not limited to a binary-type information system. What is needed in the art is a computer system including a memory device which can mimic the storage density capability of DNA and DNA-like polynucleotides.

SUMMARY OF THE INVENTION

In one embodiment, the present invention is directed to a memory device which stores information based on the molecular contents of the cell rather than the electronic state of the cell. For instance, the memory device of the present invention can include a substrate surface and an anchoring compound attached to the substrate surface at a memory cell of the device. The memory cell can then be filled with one or more polynucleotides, each of which can be attached to the anchoring compound via a linking compound. In another embodiment, the memory device of the present invention can include a memory cell on a surface that is filled with at least one information-carrying molecule, such as a polynucleotide, attached to the substrate surface by any suitable means.

Information-carrying molecules which can be utilized in the present invention can include natural polynucleotides, such as DNA or RNA, or alternatively can include synthetic polynucleotides comprising other types of backbone formations. Additionally, the polynucleotides used in the present invention can be of any suitable length. For example, in one embodiment shorter oligonucleotides can be used. In one embodiment, oligonucleotides attached to the substrate surface can comprise less than about 50 monomer units, for example between about 5 and about 20 monomer units. In one embodiment, an oligonucleotide can comprise about 10 monomer units.

In another embodiment, the memory device of the present invention can comprise a plurality of memory cells. In this embodiment, each memory cell can either be filled with one or more oligonucleotides or may be left empty. Moreover, the base sequence of the oligonucleotide(s) filling any one memory cell can be the same or different as the base sequence of the oligonucleotide(s) filling adjacent memory cells. For example, different oligonucleotides can be utilized to fill different cells. For instance, oligo-A, oligo-T, oligo-C, and oligo-G oligomers can be used to fill cells.

The memory cells of the device can be very close together, increasing information storage density of the device. For example, the memory cells can be less than 500 nm apart. In one embodiment, the memory cells can be less than 100 nm apart, for instance less than about 50 nm apart. In one embodiment, the memory cells can be about 20 nm apart.

Possible substrate surfaces in the memory devices can include, for example, glass surfaces, mica surfaces, silicone surfaces, or metal surfaces.

In one embodiment, a dual binding system can be used to bind oligonucleotides to substrates and other materials in the present invention. For instance, dual-binding systems including an anchoring compound and a linking compound can be used. For example, protein-based anchoring compounds may be used with a suitable linking compound. In one embodiment, streptavidin/biotin-binding systems may be utilized. In another embodiment, antibody/hapten-binding systems may be used.

In one embodiment, the memory device can be in communication with one or more atomic force microscope (AFM) arms which can be used to write information to or read information from the device. In one embodiment, the device can be in communication with an array of AFM arms.

The present invention is also directed to a computer system that includes molecular-based memory devices and interface features such as AFM arms to communicate information thereto.

One exemplary computer system embodiment includes a memory device for storing data and instructions, a processor, and an interface between the memory device and the processor for enabling the transfer of information between such components. The memory device preferably includes a substrate having a surface that defines at least one memory cell at a memory cell address, and an anchoring compound attached to the substrate at the memory cell location. The processor is configured to selectively access the instructions and data stored in the memory device for subsequent data manipulation and/or instruction execution.

In still further exemplary computer system embodiments, the interface between the memory device and the processor includes one or more AFM arms with respective AFM tips, various control circuits and a communications bus. Such exemplary interface may be configured to attach polynucleotides to the memory device's substrate surface or to identify polynucleotides immobilized on such surface. The computer system may further include a variety of input/output (I/O) peripheral devices.

The present invention is also directed to methods for writing information onto the memory device and methods for reading information from the device.

A writing method can involve, for instance, attaching an oligonucleotide to a substrate surface. In general, the method can include providing a substrate surface which includes a functionality immobilized on the surface and providing an AFM arm which includes an AFM tip. A polynucleotide can be firmly attached to the AFM tip using any of a variety of suitable binding systems. The polynucleotide held on the tip can then approach a second polynucleotide comprising the complementary base sequence of the first strand. This second polymer can also include a functionality on the strand which can bind to the functionality immobilized on the substrate surface. When the two complimentary polymers are close enough to each other (such as less than about three angstroms), they can spontaneously form the DNA/RNA double strand helix such that the second strand can be carried by the AFM arm. The AFM arm can carry the double helix to the desired cell address on the substrate surface, and a bond can form between the functionality immobilized on the substrate surface and the functionality on the second polynucleotide strand. As the AFM arm is subsequently moved away from the cell address, the double helix can pull apart, leaving the second strand written on the substrate surface and the first strand still attached to the AFM arm.

An AFM arm can also be used to read information from the substrate surface. In this embodiment, a polynucleotide strand which is to be identified, or read, can be previously attached to the surface. An AFM arm carrying a second polynucleotide strand of a known base sequence can then be utilized to identify the first strand. When the two strands are moved into close proximity, for instance less than about 3 angstroms, the attractive forces between two complementary strands can cause a deflection in the AFM arm. Thus, when deflection of the arm is detected by a monitor, the base pair sequence of the first strand can be identified according to the known sequence of its counterpart, which is held on the arm.

BRIEF DESCRIPTION OF THE FIGURES

A full and enabling disclosure of the present invention, including the best mode thereof, to one of ordinary skill in the art, is set forth more particularly in the remainder of the specification, including reference to the accompanying figures, in which:

FIGS. 4A–4G illustrate a sequence of steps in a method for writing a single strand oligonucleotide on a functionalized substrate surface;

Figure 1:
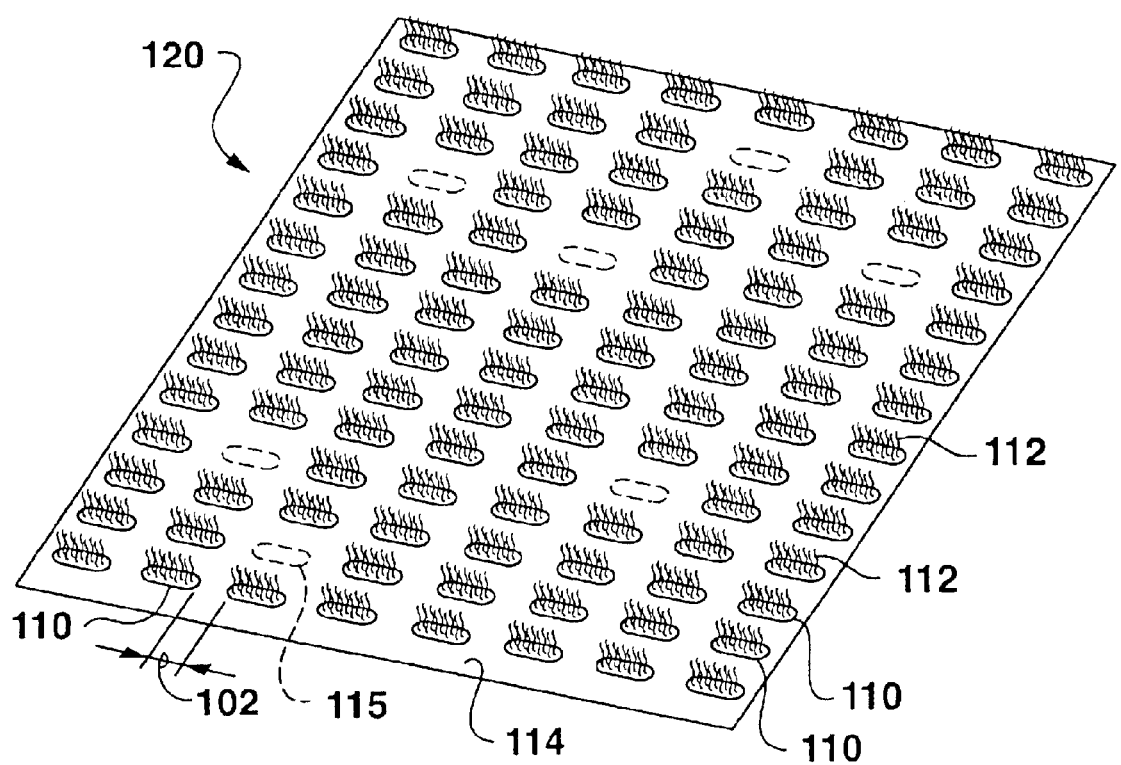
FIG. 1 is a schematic diagram of a portion of a memory device according to one embodiment of the present invention.

Repeat use of reference characters in the present specification and drawings is intended to represent the same or analogous features or elements of the present invention.

DETAILED DESCRIPTION OF THE INVENTION

Reference will now be made in detail to various embodiments of the invention, one or more examples of which are set forth below. Each embodiment is provided by way of explanation of the invention, not limitation of the invention. In fact, it will be apparent to those skilled in the art that various modifications and variations may be made in the present invention without departing from the scope or spirit of the invention. For instance, features illustrated or described as part of one embodiment, may be used in another embodiment to yield a still further embodiment. Thus, it is intended that the present invention cover such modifications and variations as come within the scope of the appended claims and their equivalents.

The present invention is directed to a memory device having very high storage density capability. For purposes of this disclosure, a memory device is defined to be a device capable of storing information, such as in a collection of individual memory cells. In one embodiment, the memory device of the present invention may also include associated hardware and/or circuitry needed to transfer information in and out of the device. In general, the memory device of the present invention includes an array of individual memory cells that store information chemically; that is, the information stored in any cell is assigned a value based on the molecular contents held in the memory cell. In a preferred embodiment, the molecules utilized for storing information in the memory cells may be single-strand polynucleotides. The present invention is also directed to methods which may be used to write and read the molecular-based memory devices. In particular, the devices may be written and read via modified atomic force microscopy (AFM) processes.

In one embodiment, the memory devices of the present invention include a plurality of memory cells arrayed on a substrate surface. Each memory cell of the device can be filled with one or more information-carrying molecules in a writing process. For purposes of this disclosure, information-carrying molecules are herein defined to be molecules which can be assigned a value. In those embodiments wherein more than one information-carrying molecule can be written in a single memory cell, all information-carrying molecules in that cell will generally be identical to each other. Additionally, individual memory cells can be empty. That is, individual memory cells need not be written with information-carrying molecules, though these cells may contain other substances, such as binding substances, for example. Thus, the information held in a memory cell can be defined according to the presence or absence of information-carrying molecules in that particular cell.

Moreover, the information-carrying molecules written in different cells of the present devices can be of different molecular structures. In these embodiments, each different information-carrying molecular structure which can be written on the device can be assigned a different value. As such, the information held in a memory cell can be defined not only according to the presence or absence of an information-carrying molecule written in the cell, but also according to the specific structure of the molecules written in that cell In a preferred embodiment, the information-carrying molecules written on the memory device can be single strand polynucleotides. In nature, polynucleotides are generally in the form of RNA or DNA molecules. DNA molecules usually are formed of a double strand of deoxyribonucleic acid polymers in which the repeating monomer unit includes a phosphate, a 2-deoxyribose pentose, and any one of four heterocyclic bases: thymine (T), cytosine (C), adenine (A), or guanine (G). RNA molecules vary from DNA in the make-up of the backbone sugars and one base. In RNA molecules, the backbone of the molecule is formed of ribose rather than deoxyribose, and the heterocyclic bases utilized include uracil (U) rather than thymine. The molecular basis of the DNA molecules' ability to function as an informational reservoir is the selective hydrogen bonding interaction and recognition between the A and T monomers and between the G and C monomers held on the adjacent strands.

The DNA molecule can contain a great deal of information in a very small linear distance. For instance, a DNA molecule only 100 monomer units in length, using only the four bases, can encode $4^{100}$ bits of information in a linear distance of about 100 nanometers. Moreover, these $4^{100}$ molecular bits, when combined together, may encode more than $10^{50}$ gigabytes of information. Moreover, DNA is very resistant to decomposition, with samples found existing in nature believed to be millions of years old. As such, memory devices which can mimic the natural information storage capabilities of the DNA molecule can not only provide excellent storage density, but may also provide extremely long-term storage devices, able to store information safely for very long periods of time, since the permanence of the information stored in the device is molecular-based and depends upon neither atmospheric conditions (within reasonable limits) nor the presence of an electrical power supply.

The present invention is not limited to polynucleotides constructed in the fashion of naturally occurring polynucleotides, i.e., DNA and RNA constructions. For instance, in certain embodiments, polynucleotides which include a variety of different backbone modifications can be utilized. These modified polynucleotides can show increased affinity, kinetics, and base pairing specificity upon binding to either natural or synthetic targets. In addition, modified polynucleotides can be even more resistant to decomposition than DNA, and can be very stable in either air or water. For instance, modified polynucleotides can be resistant to nuclease digestion. Many different modified polynucleotides are known in the art, and more are being formed for a variety of specific purposes. In general, any polynucleotide which can form the DNA-like hydrogen base pair recognition interaction can be utilized in the present invention.

Though not wishing to limit the number of possible nucleotides which can be utilized in the present invention, exemplary modified nucleotides can include modified phosphate nucleotides having the general structure:

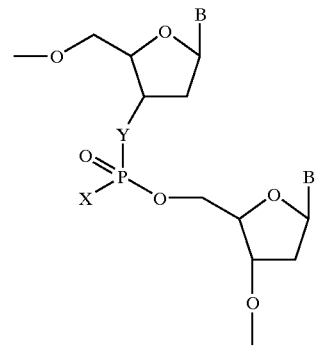

wherein $X=CH_3$, $Y=O$, or $X=S^-$, $Y=O$, or $X=O^-$, $Y=O$, or $X=O$, $Y=NH$ (phosphoramidate), and $B=$Any of the possible heterocyclic bases.

Other modified phosphate nucleotides which can be utilized in the invention include:

2'-O-MOE having the general structure:

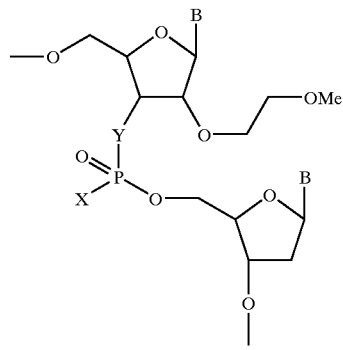

wherein B, X and Y may be as described above, and LNA having the general structure of:

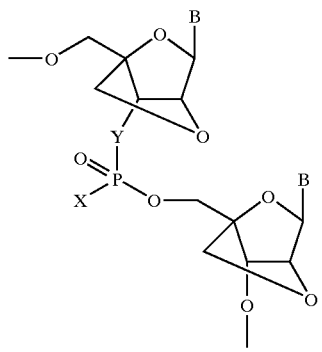

wherein B, X and Y may be as described above.

Other exemplary modified nucleotides which may be utilized include phosphorothioate (PS) nucleotides, in which one of the non-bridging oxygen atoms in the phosphodiester group has been replaced with a sulfur atom; boranophosphate nucleotides, in which one of the non-bridging oxygen atoms in the phosphodiester group has been replaced with borane ($BH_3$); dinucleotide analogues with any of a number of different linker groups including various ureas, carbamates, amides, alkyl, alkenyls and alkynyl chains; nucleotides incorporating methylene(methylimino) linkages, formacetal linkages, or thioformacetal linkages; and a variety of nucleotides comprising backbones in which the $PO^{2-}$ group has been replaced with $SO_2$ groups. Other modified nucleotides useful in the present invention include nucleotides comprising whole backbone replacements in which both the phosphodiester linkage and the sugar of DNA are replaced with alternative functionality, such as is the case with peptide nucleic acids (PNA), in which the backbone consists of N-(2-aminoethyl)glycine units with the bases attached via a side chain amide linkage.

According to the present invention, an information storage device is disclosed in which in one preferred embodiment, the information storage efficiency and effectiveness found in the natural DNA molecule has been attained, while the difficulties associated with attempting to construct a chain of DNA monomers and then decode each single monomer of the DNA molecule have been avoided. More specifically, rather than attempting to write and read an individual single strand of DNA polymer, wherein a single bit of information is held as a single monomer unit on the polymer chain, the memory device of the present invention utilizes a polynucleotide to fill an individual memory cell and hold information. Polynucleotides, as opposed to single monomers of the DNA molecule, can not only be manipulated with relative ease, but can also be identified and differentiated by use of modern assay techniques such as those utilizing AFMs. In addition, oligonucleotides of various construction are readily available in the art from a variety of sources such as, for example, Oligos Etc Inc/ Oligotherapeutics Inc. of Wilsonville, Oreg., or Applied Biosystems of Foster City, Calif.

FIG. 1 is a schematic diagram of one embodiment of a portion of a memory device 120 according to the present invention. The memory device 120 includes an array of individual memory cells 110 each of which can be empty of information-carrying molecules, as at 115, or can include one or more information-carrying molecules such as oligonucleotides 112 bound to the substrate 114. While a cluster of oligonucleotides 112 are illustrated in a single cell 110 in this particular embodiment, it should be understood that in other embodiments a memory cell 110 may optionally be filled with only a single oligonucleotide.

In general, polynucleotides useful in the device can be of any length which can be manipulated and identified according to the presently disclosed processes. For instance, though often referred to throughout this disclosure as oligonucleotides, it should be understood that the information-carrying molecules of the presently disclosed devices may include polymers of any suitable length. For instance, though a variety of oligomers may be used in the devices which are of a relatively short length, such as less than about 100 monomer units, this does not preclude other embodiments wherein much longer polymers may be utilized, including hundreds or even thousands of monomer units on an individual chain.

In one embodiment, oligonucleotides may be utilized which are less than about 50 monomer units in length. For example, the oligonucleotides can be between about 5 and about 20 monomer units in length. For example, in one embodiment, oligonucleotides may be used which are about 10 monomer units in length. Polynucleotides formed of a great number of monomer units may alternatively be utilized in some embodiments of the invention, though these embodiments may require an increase in spacing between individual cells on the device, or alternatively some other separation technique between individual cells, such as the addition of a membrane or some other type of barrier between the cells, in order to prevent interaction between oligonucleotides of complementary base pairs held in adjacent cells. In addition, it may be necessary to selectively design longer polynucleotides to prevent the strands from curling, bending or otherwise becoming physically deformed.

Referring again to FIG. 1, the distance 102 between individual memory cells 110 is somewhat greater than the distance between individual monomer units of a DNA polymer chain (about 10 nm). However, the distance 102 between individual memory cells 110 of a memory device 120 can be less than that of known electrically-based memory cells, increasing information storage density of a single memory device greatly over that obtained in the past utilizing electrical constructions. For instance, distance 102 between individual memory cells can generally be less than about 500 nm. In one embodiment, distance 102 between memory cells 110 can be less than 200 nm, such as between about 50 nm and about 150 nm. For example, distance 102 between memory cells 110 can be about 100 nm.

While the increase of information storage density on the presently disclosed storage devices due to decrease in memory cell size is enormous, this is not the only source of storage density increase available. Storage density of the devices may also be increased due to the variation in structure possible in the information-carrying molecules themselves. For example, in one embodiment, memory cells may be filled with oligonucleotides consisting of 10 monomers, all of which carry identical bases. When utilizing all four bases available, possible oligonucleotides available to fill memory cells in this embodiment can thus include oligomers constructed of 10 A units, 10 T units, 10 C units, or 10 G units, with a total of four different oligomers available. Thus, in this particular embodiment, each memory cell of the device can hold any one of five different possible pieces of information, the four possible oligomers available as well the possibility of an empty cell. This expansion from a binary system, in which any one cell can hold any of two possible pieces of information, to a system in which any one cell can hold any of five possible pieces of information, provides a huge increase in the amount of information storage density available. For instance, when combining the information held in multiple memory cells, one byte in a standard binary information system can store up to 256 different possible pieces of information ($2^8$=256). In this embodiment of the present device, in contrast, one byte can store up to $5^8$ or 390,625 different possible pieces of information. When combined with the increase in storage density due to the small size of the memory cells, the memory device of the present invention can provide extremely large information storage density. For instance, by use of a five-fold information system using four different possible oligonucleotides, with individual cells spaced about 100 nm apart, storage density of between about 800 and about 1000 Gb/in$^2$ can be achieved.

The presently disclosed memory device is not limited to four different oligonucleotides, however. For example, in other embodiments, the monomer units of the oligomers planted in each memory cell need not be identical to each other, and any combination of the four possible monomers may be utilized in forming the different oligomers of the device. For example, when the oligomers are formed of x monomer units, and each monomer on the strand can be any one of the four nucleotides, any individual memory cell can contain any one of ($4^x$+1) bits of information. Moreover, when y different memory cells are combined together, those cells together can contain ($4^x$+1)$^y$ pieces of information. Thus, a three-dimensional information array can be constructed, capable of containing a vast amount of information in a relatively small space.

Figure 2:
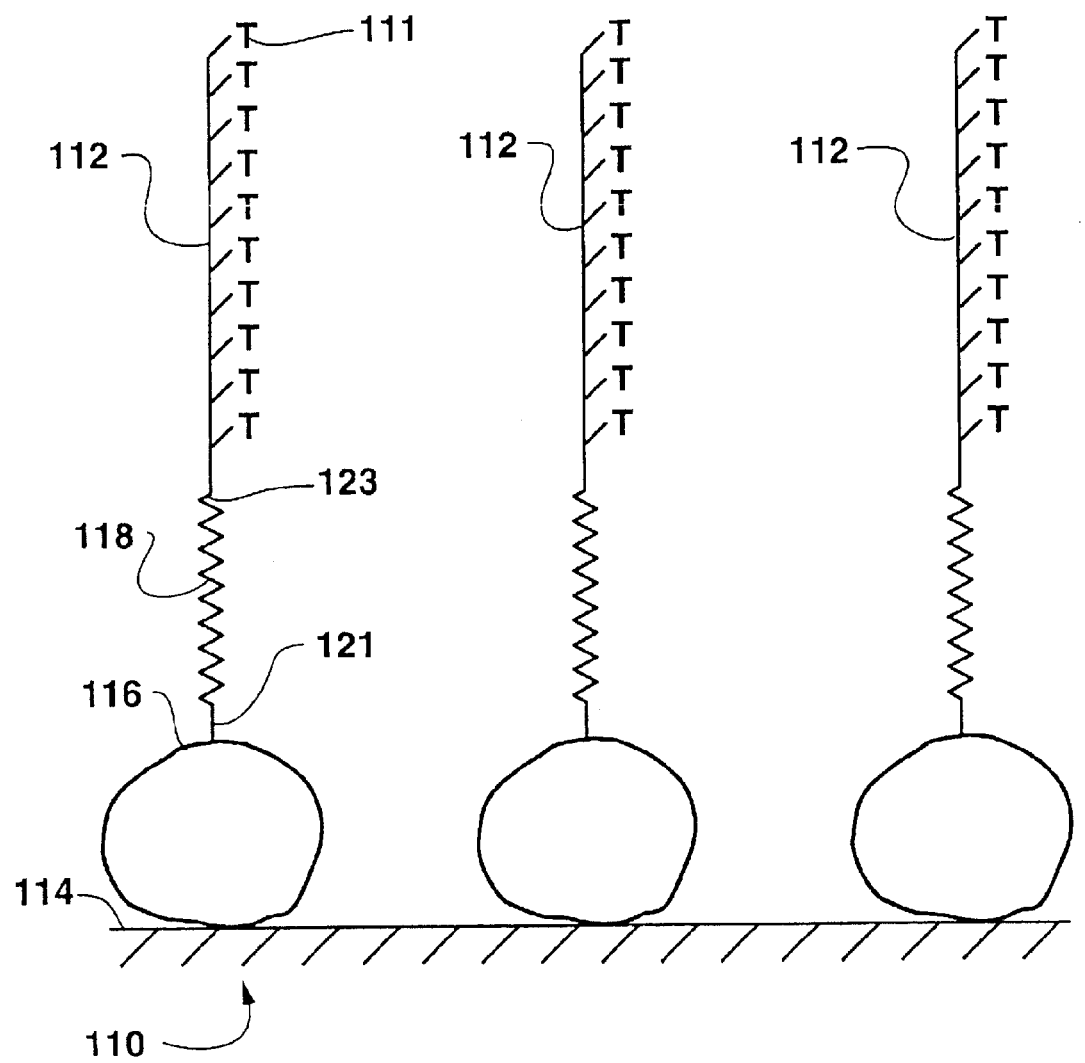
FIG. 2 is a schematic diagram of single strand oligonucleotides bound to a substrate surface.

FIG. 2 shows one embodiment of three single strand information-carrying oligonucleotides 112 bound to the surface of a substrate 114 at a memory cell address 110 via a dual binding system. In this particular embodiment, the oligonucleotides 112 are shown as comprising 10 identical thymine (T) monomer units 111, but the oligonucleotides 112 can alternatively comprise any combination of any of the four available bases.

Substrate materials which can be utilized for the memory devices can generally include materials which may provide a surface that can allow binding of the oligonucleotides. For example, the substrate surface 114 may be quartz, mica, silicone, or a metal deposited on a quartz, mica, or silicone surface.

Each oligonucleotide 112 can be bound to the substrate 114 in a memory cell 110 during a writing process, which will be discussed further herein. In general, the writing process involves the attachment of one or more information-carrying molecules to the substrate surface at each memory cell address. Obviously, the faster this attachment can be formed, the faster information can be written on the device. As such, binding systems for bonding the molecules to the surface which provide very quick bond formations may be preferred in some embodiments of the writing process. For instance, in one embodiment, a dual binding system may be utilized which includes an anchoring compound 116, which can be firmly attached to the substrate surface prior to the writing process, and a linking compound 118, which can be a heterobifunctional substance that has a portion of the molecule 121 that is functionalized to bind to the anchoring compound 116 during the writing process, and a portion of the molecule 123 that is functionalized to bind to an information-carrying molecule such as oligonucleotide 112. Many known dual binding systems can be utilized which can form a bond between an anchoring compound 116 and a linking compound 118 essentially instantaneously, and as such may be preferred in some embodiments of the present invention.

In general, in those embodiments utilizing a dual binding system, an anchoring compound 116 can be coated onto the substrate surface 114 prior to the writing process. In some embodiments of the invention, the substrate surface can already contain suitable reactivity such that the anchoring compound may spontaneously attach to the surface with no pretreatment of the surface necessary. However, in other embodiments, pretreatment of the substrate surface (e.g. functionalization of the surface) prior to attachment of the anchoring compound may be desired. In general, functionalization may be increased on some surfaces through addition or creation of, for example, amine, carboxylic acid, hydroxy, aldehyde, thiol, or ester groups on the surface prior to contact with the anchoring compound. For example, in one embodiment a substrate surface may be aminated through contact with an amine-containing compound such as 3-aminopropyltriethoxy silane in order to increase the amine functionality of the surface and bind the anchoring compound to the surface via the added amine functionality.

Following any desired functionalization of the substrate surface, an anchoring compound of a dual binding system may be coated on the substrate surface. One possible example of a dual binding system which may be utilized in the present invention is a streptavidin/biotin binding system. For example, the anchoring compound 116 can be a streptavidin molecule, and the linking compound 118, can include a biotin molecule 121 on the end of a carbon chain. Streptavidin is a tetrameric protein which binds very quickly and tightly to biotin, a growth factor present in minute amounts in every living cell. The carbon chain can be of any suitable length and can provide some space for ease of manipulation of the oligonucleotide which can be attached to the end of the chain 123, opposite the biotin 121. For example, in one embodiment, the carbon chain can be less than about 20 carbons. The streptavidin/biotin binding system is commonly used for binding biological materials to other substances due to the very secure bond formed between the two molecules.

In one embodiment, streptavidin may be coated on the substrate surface via functionalization added to the streptavidin that allows immobilization on the substrate surface. For example, in one embodiment, the substrate surface 114 can be gold, and streptavidin may be immobilized on the surface through incorporation of thiol groups into the streptavidin structure. In another embodiment, the substrate surface 114 may be a silicon, and streptavidin may be modified to contain any one of a number of silane functional groups that may allow streptavidin immobilization on the surface. In yet another embodiment, biotin may first be adsorbed onto the substrate surface, such as through a reaction between the amine groups on an aminated glass surface and a modified biotin, such as a succinimide-modified biotin, for example, and streptavidin may then be immobilized onto the surface via the adsorbed biotin. These are merely exemplary techniques, however, and any suitable coating method known in the art may be utilized for the purpose of immobilizing streptavidin on a substrate surface.

Other possible dual binding systems can alternatively be used, however. For example, antibody/hapten bridging systems can be utilized. Haptens are molecules which, when coupled to a suitable macromolecule, can be made antigenic and stimulate an immune response. For instance, haptens in the dinitrophenyl group, such as 2,4-dinitrophenyl, for example, are commonly used in immunological processes. In this particular embodiment, the antibody which binds to the hapten can be used as an anchoring compound, and its hapten can be attached (with or without a space increasing carbon chain) to either end of an oligonucleotide as a linking compound.

It should be understood that the role of each compound in any dual binding system can also be reversed. For instance, an antibody can function as the linking compound and its hapten can be the anchoring compound In another embodiment, an anchoring compound can be attached to the surface which, while not necessarily a biological compound such as an antibody, can bond to a peptide which can be attached to an oligonucleotide and function as a linking compound. For example, a nickel-nitrilotriacetic acid chelation such as any of a number of suitable Ni-NTA products available from Qiagen, Inc. of Valencia, Calif., can be attached to an aminated substrate surface as an anchoring compound, and a histidine polypeptide containing at least six histidine monomers can be utilized as a linking compound.

Yet another example of a dual binding system which can be used in the present invention includes a linking compound which may be nothing more than a single chemical group added to the end of an oligonucleotide. For example, in one embodiment of the present invention succinimidyl 4-(N-maleimidomethyl)cyclohexane-1-carboxylate (SMCC, or alternatively Sulfo-SMCC both of which are available from Pierce Biotechnology, Inc. of Rockford, Ill.) both of which include a succinimide group on one end and a maleimide group on the other, can be utilized as an anchoring compound. For example, SMCC can be bound to an aminated substrate surface by way of the succinimide group, leaving the maleimide group on the other end to react with a linking compound, which can be, in one embodiment, nothing more than a sulfhydryl group. For instance, oligonucleotides can be utilized which have been functionalized to contain a sulfhydryl group at either end of the chain in order to link the oligonucleotide to the substrate surface via the maleimide group on the anchoring compound.

An oligonucleotide may be functionalized to contain a sulfhydryl group on one end by any suitable process. For example, cystamine may be reacted with water soluble carbodiiamide (EDC, available from the Pierce Biotechnology, Inc.) in the presence of amidazole and the desired oligonucleotide. The reaction product may then be reduced, such as in the presence of 100 $\mu$M 2-mercaptoethanol, for instance, to form an oligonucleotide-P—N—$C_2H_4$—SH linkage at the end of the chain.

In yet another embodiment, a dual binding system can be utilized in which the oligonucleotide is bound to the substrate surface by formation of a disulfide bond. For instance, an oligonucleotide may be functionalized to contain a sulfhydryl group, as described above, and an anchoring compound can be coated on the substrate surface which also includes sulfhydryl group. For example, the substrate surface may be coated with streptavidin which has been reacted with biotin-HPDP, which includes a terminal pyridine thiol group. When this surface is subsequently treated with a reducing agent such as 2-mercaptoethanol, for instance, the disulfide bond may be broken leaving a sulfhydryl group exposed on the substrate surface. The sulfhydryl on the oligonucleotide and the sulfhydryl on the substrate surface can then react under oxidative conditions to form a disulfide bond between the two and immobilize the oligonucleotide on the substrate surface. In one embodiment, oxidative conditions may be encouraged by the addition of a 10 $\mu$M solution of hydrogen peroxide. Alternatively, oxidative conditions may be merely encouraged by the removal of reducing agents.

The above-described dual binding systems are exemplary systems only, and the disclosed invention is not limited to these exemplary systems. Furthermore, whereas dual-binding systems may be preferred in certain embodiments, the use of such systems is not a requirement of the present invention, and alternative binding systems may be utilized in other embodiments. For example, in other embodiments, a single heterobifunctional-anchoring compound may be utilized which contains functionalizations capable of binding to both the substrate surface and to the oligonucleotides. Essentially any binding system can be utilized to attach the oligonucleotides to the substrate surface, provided the forces holding the oligonucleotides to the substrate are stronger than the hydrogen bonds which hold a double strand oligonucleotide helix together.

According to the present invention, both the writing process, in which molecular material can be placed in a memory cell, and the reading process, in which the molecular contents of the cells can be identified, can be carried out by use of one or more AFM arms. AFM arms have been utilized in many nanomechanical and molecular recognition applications. (See, for example, U.S. Pat. No. 6,218,086 to Binnig, et al., U.S. Pat. No. 6,249,747 to Binnig, et al., U.S. Pat. No. 5,807,758 to Lee, et al. and U.S. Pat. No. 5,992,226 to Green, et al., all of which are incorporated herein as to all relevant matter). Generally, an AFM arm consists of an extremely small tip which may have an apex on the scale of a few nanometers, and a cantilever arm capable of inducing (in the case of nanolithography applications) or registering (in the case of molecular recognition applications) extremely small changes in tip orientation. For instance, in nanolithography processes, the cantilever arm of an AFM can be deflected, such as with a piezoelectric oscillator, when held over a substrate, in order to bring the tip of the arm into contact with a surface and create desired topographical changes on the surface. In certain molecular recognition applications, intermolecular interactions can be registered between a compound held on the AFM tip and a second compound held in a sample which will react with the first compound due to deflections in the tip caused by the interactive forces between the compound as the tip passes across the sample.

According to the present invention, a combination of nanolithography techniques and molecular recognition techniques may be utilized to write and read the disclosed memory devices. More specifically, oligonucleotides can be immobilized on an AFM tip to form a modified AFM arm which can function as an interface in communication with the memory device and be used to either write information on a substrate surface or alternatively to read information from a substrate surface, as desired.

Figure 3:
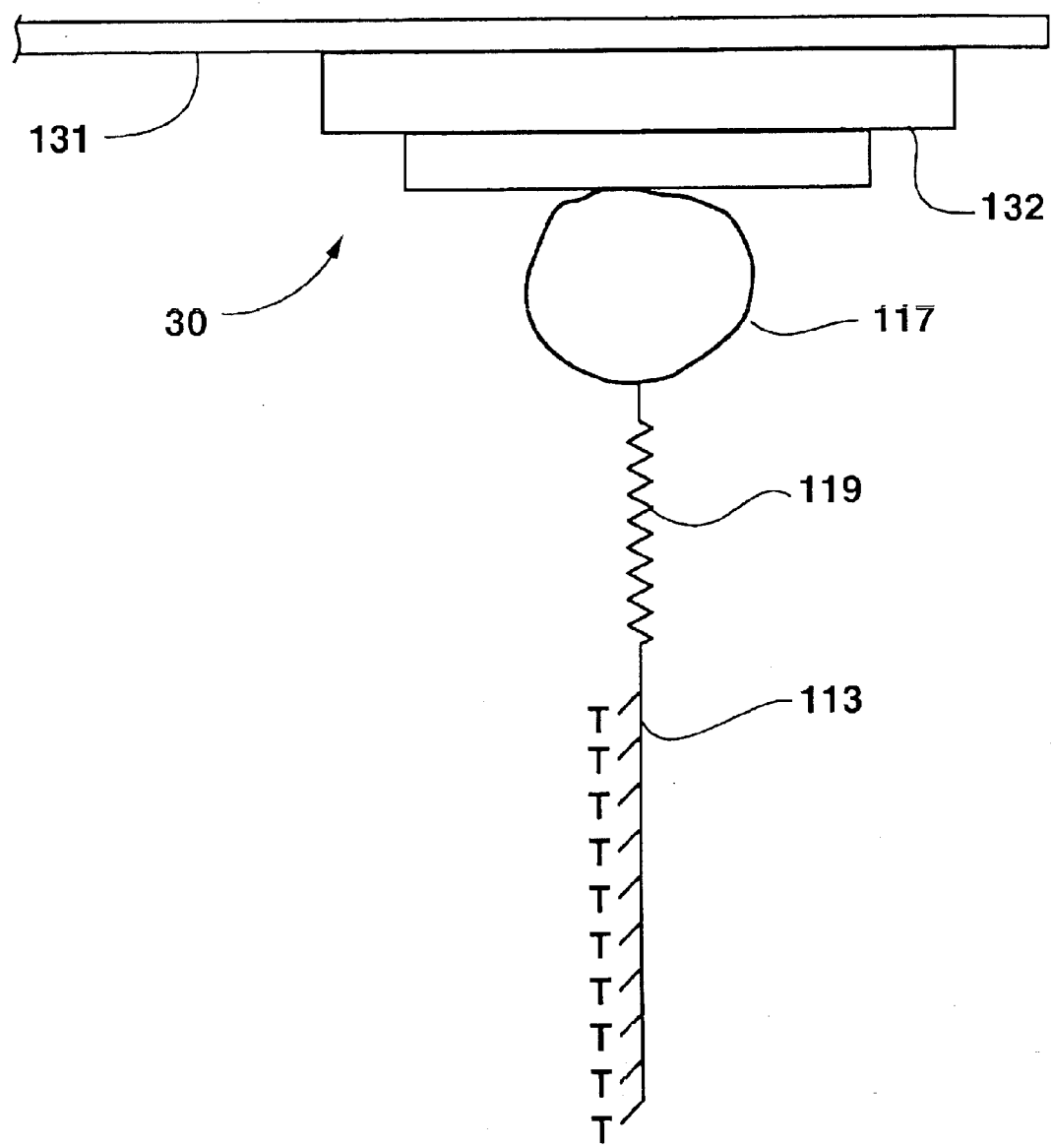
FIG. 3 is a schematic diagram of a single strand oligonucleotide bound to an AFM tip.

FIG. 3 illustrates a portion of one embodiment of a modified AFM 30 which includes a cantilever arm 131 and a tip 132 to which is bound a oligonucleotide 113. For instance, in one embodiment, the oligonucleotide 113 may be bound to the tip 132 via an anchoring compound 117, such as streptavidin and a linking compound 119, such as a biotin attached to a carbon chain. The anchoring compound 117 can be immobilized on the tip 132 via any suitable process, as previously discussed in regard to the immobilization of an anchoring compound on a substrate surface. The AFM tip 132 with the anchoring compound 117 attached can then be contacted with oligonucleotides 113 modified to contain a linking compound 119. For instance, in one embodiment, a streptavidin-coated AFM tip can be contacted with biotin-modified oligonucleotides. Upon contact, the anchoring compound 117 can be saturated with the linking compound 119, and the oligonucleotide 113 can be tightly bound to AFM tip 132 via reaction between the biotin at the end of the linking compound 119 and the streptavidin anchoring compound 117. Though only a single oligonucleotide is illustrated in FIG. 3, in other embodiments, a single modified AFM tip may contain more than one oligonucleotide, with the total number of oligomers attached to the tip depending on the tip size, as well as the functionality of both the anchoring and linking compounds. For instance, in a streptavidin/biotin system, the streptavidin-anchoring compound may react with as many as four biotin molecules. Moreover in the embodiment illustrated in FIG. 3, the oligonucleotide 113 is bound to the tip 132 via a linking compound 119 and an anchoring compound 117, but any other suitable binding mechanism may be alternatively utilized. The modified AFM tip may be utilized to both read and write information on the disclosed storage devices.

FIGS. 4A–4G schematically illustrate in sequence one embodiment of a writing process wherein a single oligonucleotide can be written on a substrate surface in order to fill a single memory cell. At FIG. 4A, the modified AFM, including oligonucleotide 113 attached to tip 132 via linking compound 119 and anchoring compound 117, can be moved via any suitable method to a bank 124 which contains a multitude of oligonucleotides 112. Oligomers 112 are formed of a sequence of nucleotide bases which are the complement of the sequence of nucleotide bases forming oligomer 113. Furthermore, oligomers 112 can be modified with linking compound 118, which can be the same or different as linking compound 119. For example, linking compound 118 and linking compound 119 can both be biotin. In either case, linking compound 118 and linking compound 119 can be at the same end of their respective oligonucleotides. For instance, in those embodiments wherein linking compound 119 is at the 5' end of oligonucleotide 113, linking compound 118 can also be at the 5' end of oligonucleotide 112.

Figure 4A:
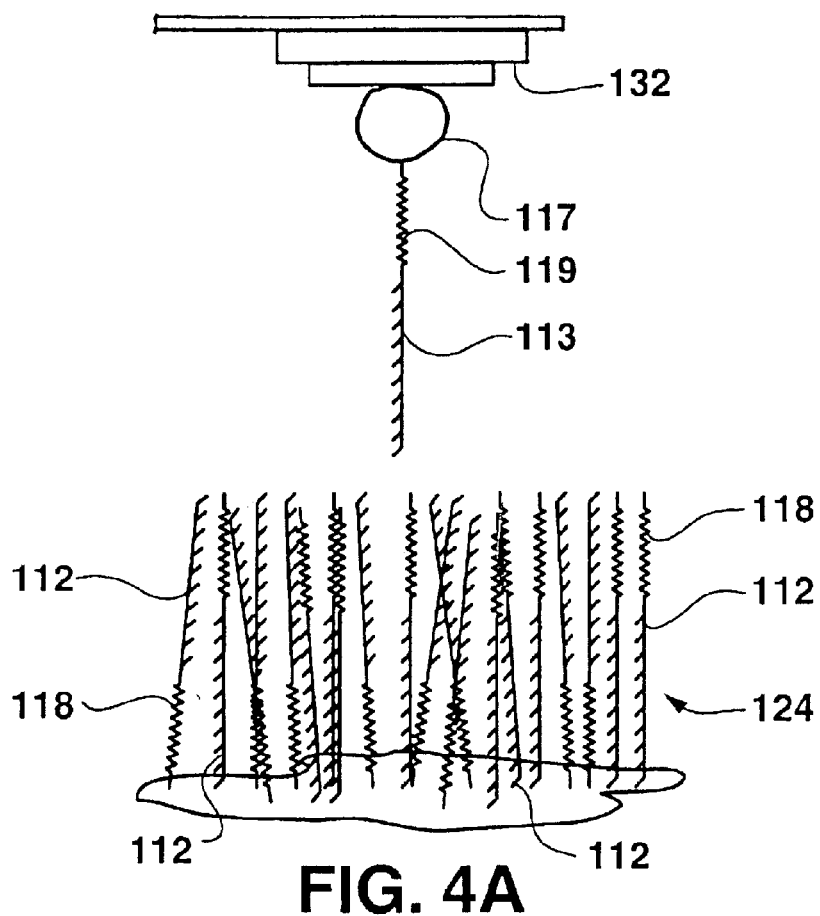
Figure 4B:
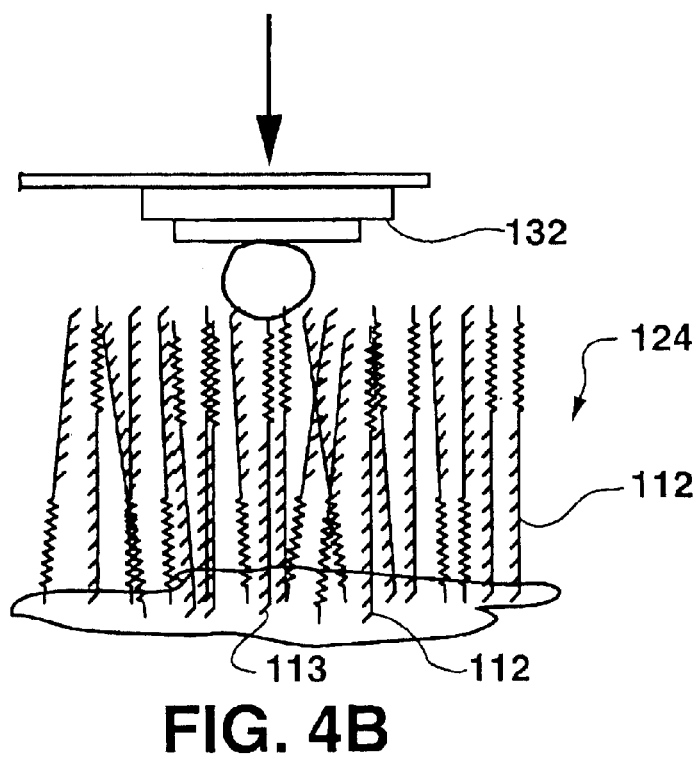
Figure 4C:
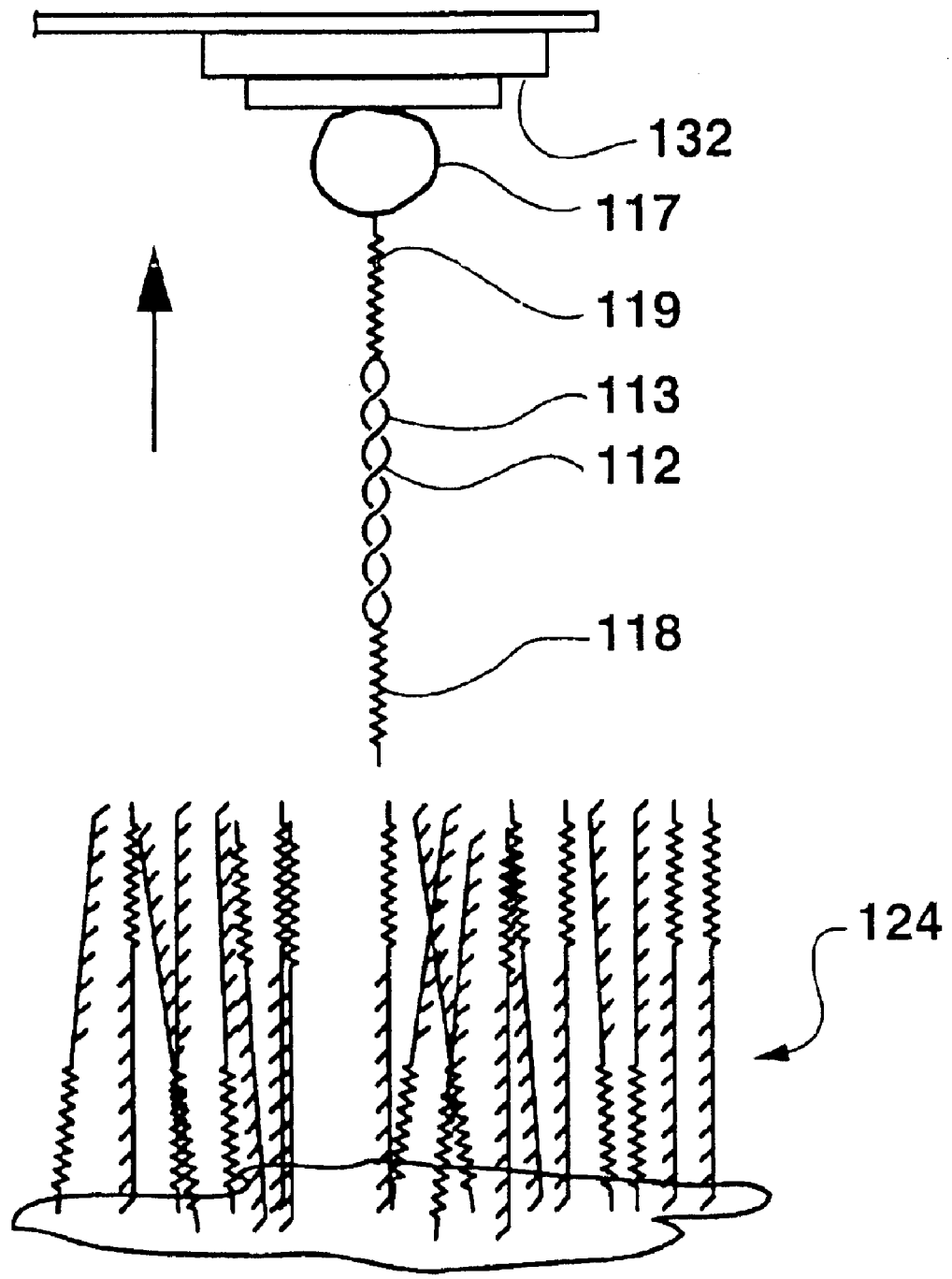

At FIG. 4B, oligonucleotide 113 bound to AFM tip 132 contacts bank 124 containing a multitude of oligomers 112. As oligomers 112 are the complementary strand to oligomer 113, upon contact a DNA-type double-strand helix can form which includes oligomer 113 bound to tip 132 and complement oligomer 112 which has an unbound linking compound 118 attached. This double strand complex is shown at FIG. 4C.

Figure 4D:
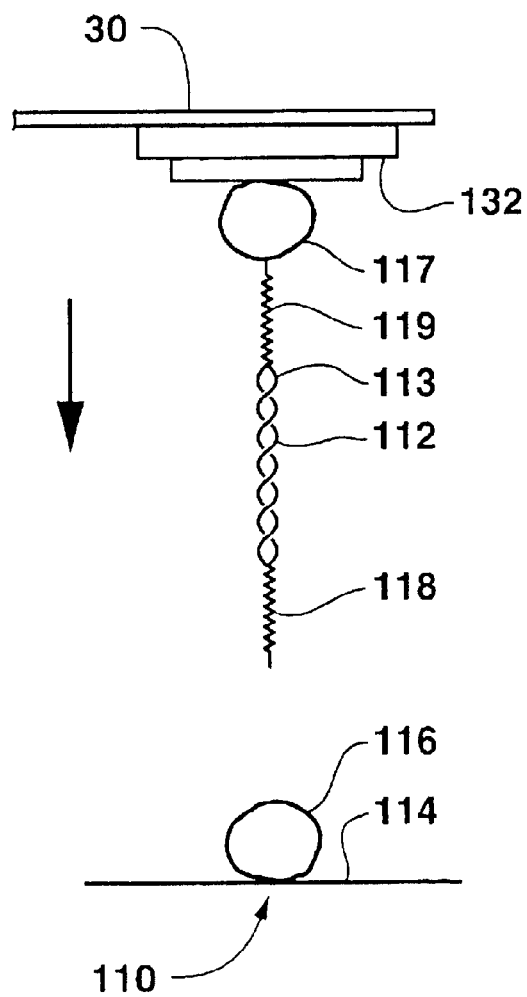
Figure 4E:
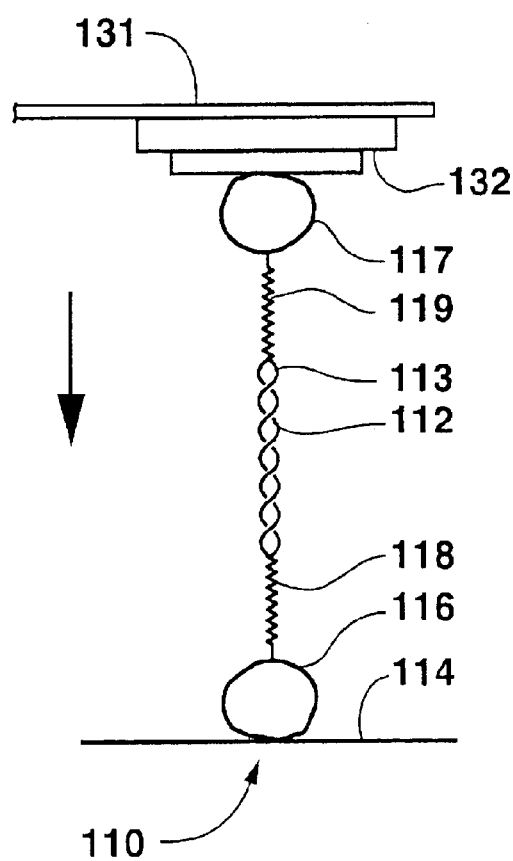

At FIG. 4D the AFM arm 30, loaded with oligomer 112, is moved to a memory cell address on the substrate 114 which has been previously coated with anchoring compound 116. At FIG. 4E the tip 132 is lowered toward substrate 114 at the memory cell 110 address to a height where linking compound 118 and anchoring compound 116 can react. As the bond formed between the anchoring compound 116 and the linking compound 118 is stronger than the hydrogen bonding which holds the DNA-type double helix together, when the AFM tip is moved away from memory cell 110 (as shown at FIG. 4F), the double helix can pull apart leaving oligomer 112 affixed to the substrate surface 114 at memory cell 110, and complementary oligomer 113 still bound to tip 132, as shown at FIG. 4G. Thus, the memory cell 110 can be filled with oligomer 112, and the modified AFM including oligomer 113 can return to bank 124 and be utilized to fill another memory cell at another address with oligomer 112.

Using current AFM technologies, it is possible to write information at a rate of about 10 msec/cell using a single AFM arm operating at about 4.5 Hz.

A single tip 132 which has been modified to carry an oligomer 113 can be utilized repeatedly to plant the complement oligomer 112. Similarly, an AFM arm carrying a tip modified to hold a different oligomer can be used for each different oligomer which can be written on the device. For instance, in a binary system, wherein a memory cell contains either a 0 or a 1, defined by the presence or absence of any oligomer, only a single AFM tip will be required for writing, as only a single type of oligomer need be planted. Additional AFM tips may be utilized, however, in order to increase the writing speed of the system. In a multi-bit writing process, AFM tips carrying other constructions of oligomers may be added to the system for each different molecule to be planted. For instance, in a system including four different oligonucleotides consisting of oligo-A, oligo-G, oligo-C, or oligo-T monomers, a minimum of four AFM arms may be utilized for the 5-fold information system, one arm for each different oligonucleotide to be planted. In this embodiment, the four AFM arms may be designed to function sequentially or in unison to fill each address of the array with any one of the four possible oligomers or to leave an address empty, as desired. Moreover, additional arms may be added in order to increase the writing speed of the system. For instance, an array of arms may be utilized wherein each row of an array can write a single row of memory cells on the substrate surface.

Figure 5A:
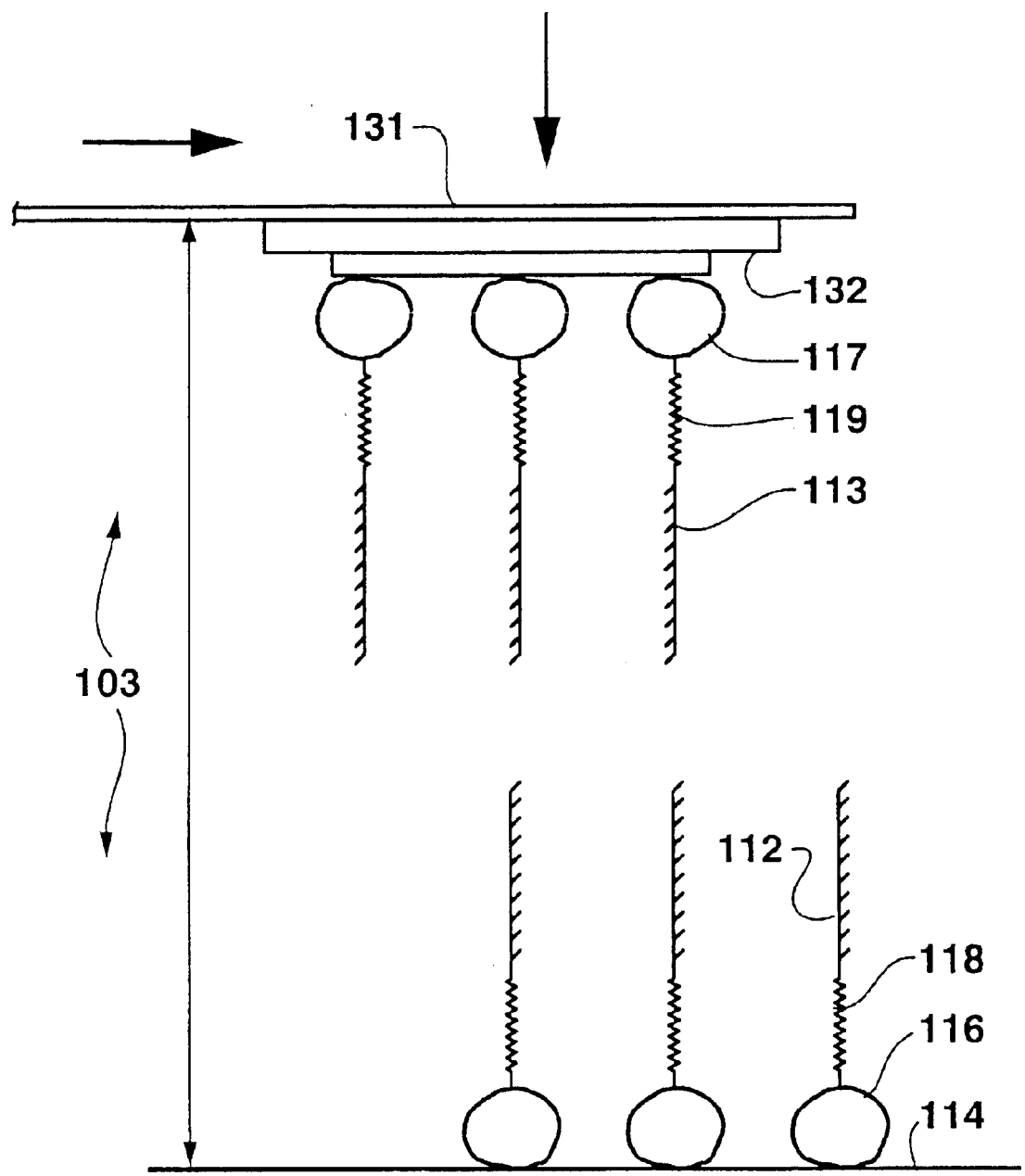
FIGS. 5A–5C sequentially illustrate a method for identifying a cluster of oligonucleotides of unknown base sequence held on a surface by use of a modified AFM arm.

A modified AFM such as that illustrated in FIG. 3 can also be utilized to read the information stored in a memory cell following the writing process described above. For instance, as illustrated in FIG. 5A, a modified AFM including tip 132 to which oligonucleotides 113 have been bound, can be pulled across a memory cell at a height 103 above the substrate. When tip 132 carrying oligonucleotides 113 passes a memory cell containing oligonucleotides 112, which are the complementary strands to strands 113, such that the two oligonucleotides are close enough to register interaction forces (such as about 3 angstroms or less), the interaction forces between the two complimentary oligomers can cause deflection of the cantilever 131.

In one embodiment, the reading process can take place in a liquid medium, so as to obtain cantilever deflection values which may be more readily monitored by the system. Any one of a large number of possible methods may be employed to monitor the deflection of the cantilever including, for example, fiber optic interferometer, optical lever monitoring by use of laser probes, interferometer, tunneling, capacitance, single diode, and piezoresistive cantilever detection schemes.

Figure 5B:
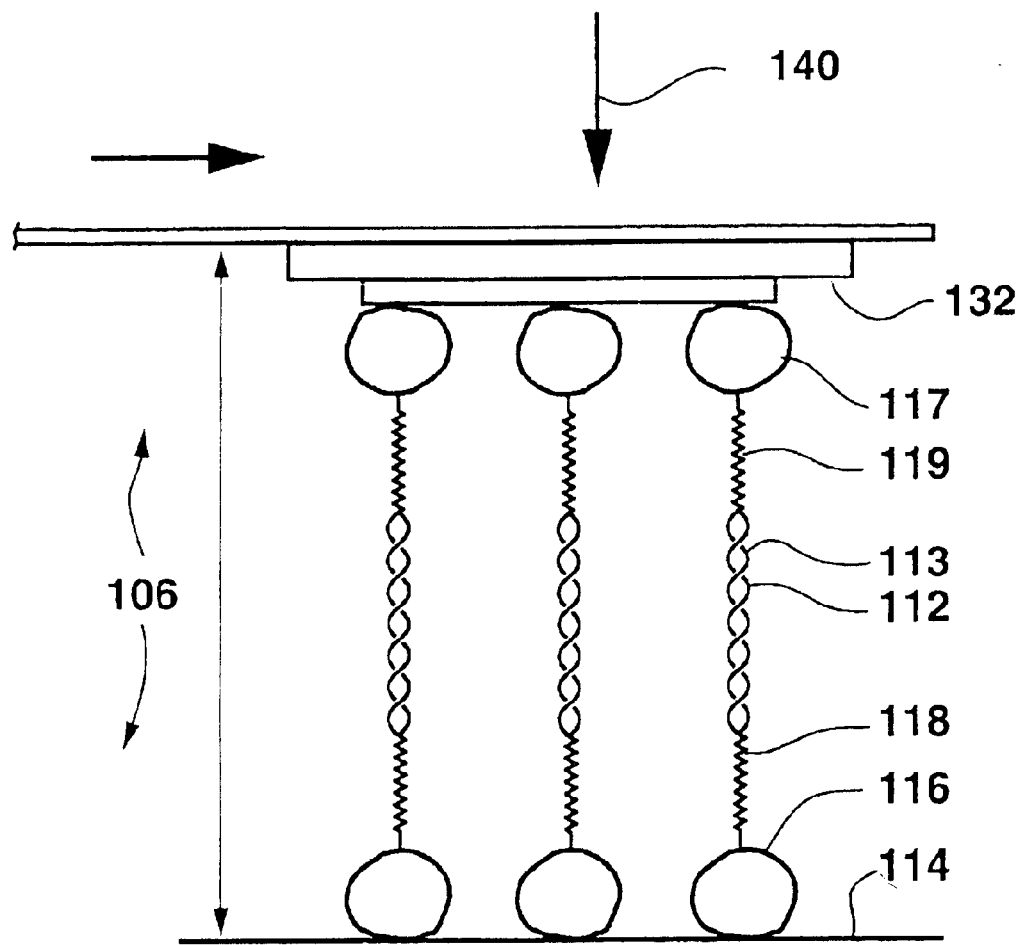
Figure 5C:
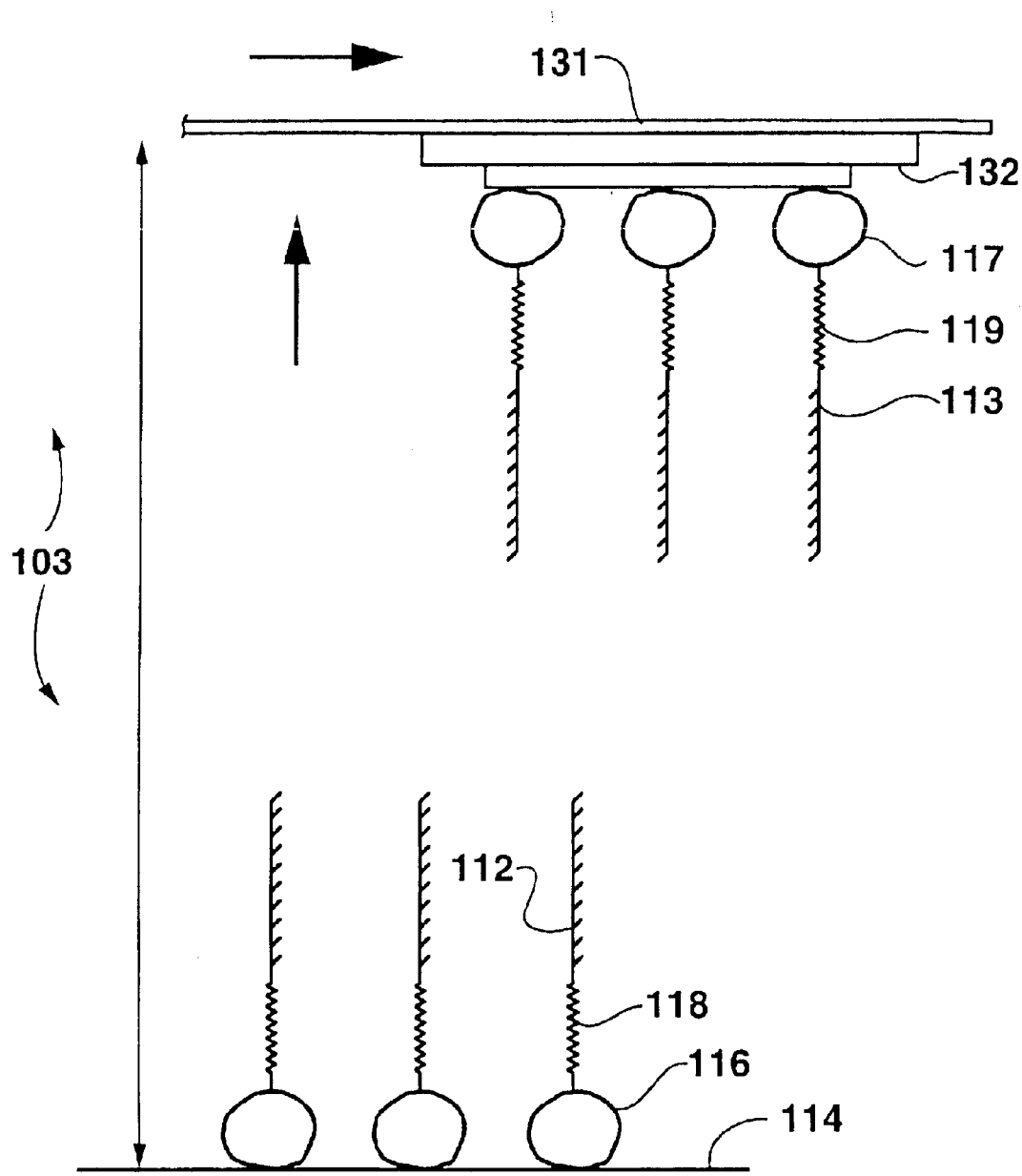

FIGS. 5A–5C schematically illustrate the height changes of an AFM arm 131 in relation to the substrate surface 114 as the tip 132 is pulled across a memory cell which contains the complement oligomer 112 of the oligomer 113 that is bound to the tip 132. At FIG. 5B, the interaction forces between oligomer 112 and the complement oligomer 113 cause the cantilever arm to be deflected toward the substrate surface due to the interaction forces between the complementary oligonucleotides, as shown by arrow 140, and the double helix can be formed. The height 106 of the tip 132 above the substrate surface 114 as the interaction forces cause deflection will be less than height 103, when these interaction forces are not acting upon arm 131. As the arm 131 moves away from the cell at FIG. 5C, the interaction forces recede and the arm 131 is returned to the original height 103.

Similar to the processes for writing on the device, a single modified tip 132 can be utilized in the reading process to recognize one specific construction of oligonucleotide. The very selective hydrogen bonding interaction and recognition between the A and T monomers and between the G and C monomers of the nucleotide chains will prevent reading of false positives in the device. When two oligomers, one held on the tip and one held on the substrate surface, are an exact complementary match, the interaction forces between the two strands can be large enough to cause deflection in the cantilever arm 131. The selectivity of DNA-like interaction is such that if even a single monomer of a strand does not find its complement on an adjacent strand, the interaction forces will not be nearly as strong as when the entire length of both oligomers complement. Thus, in any other than a complete match, the minimum deflection value, which can depend on oligomer length, system medium, as well as other system characteristics, will not be met.

For example, in some embodiments, oligomers including a combination of any of the four different possible bases may be utilized. In this embodiment, a portion of the oligomer held on the AFM arm may complement only a portion of the oligomer planted in a memory cell. Any deflection caused by a partial match will be much smaller, however, than the deflection caused by a complete match between the two oligomers. In this embodiment, the parameters of the deflection monitor may be set such that only those interaction forces attained with a complete complementary match between oligomers may be registered in order to accurately recognize the contents of any individual memory cell.

Utilizing current AFM technology, information can generally be read from the presently disclosed devices at least as fast as it can be written. For instance, in one embodiment, information can be read from a substrate surface at a rate of about 10 $\mu$sec/cell utilizing an AFM arm operating at a rate of about 1 kHz. In another embodiment, even faster reading rates are available, and information can be read at a rate of about 10 nsec/cell utilizing a single AFM arm operating at a rate of about 1 MHz As any single modified tip construction can only recognize those memory cells containing the complement to the oligonucleotide held on that tip, the reading system of the present invention will contain at least one tip for each different oligonucleotide to be utilized in the device. In one embodiment of the invention, illustrated in FIG. 6, a reading array 126 including a multitude of AFM tips can be utilized to read an array 120 of memory cells 110 very quickly. As can be seen, FIG. 6 includes a substrate surface 114 upon which individual memory cells 110 have been written in rows. The system also includes a reading array 126 which includes an array of AFM cantilever arms in general 131, each carrying a modified tip (not shown). According to this embodiment, a single row 105 of the reading array 126 can include one modified tip dedicated to each possible different oligonucleotide which can be written on the substrate 114.

Figure 6:
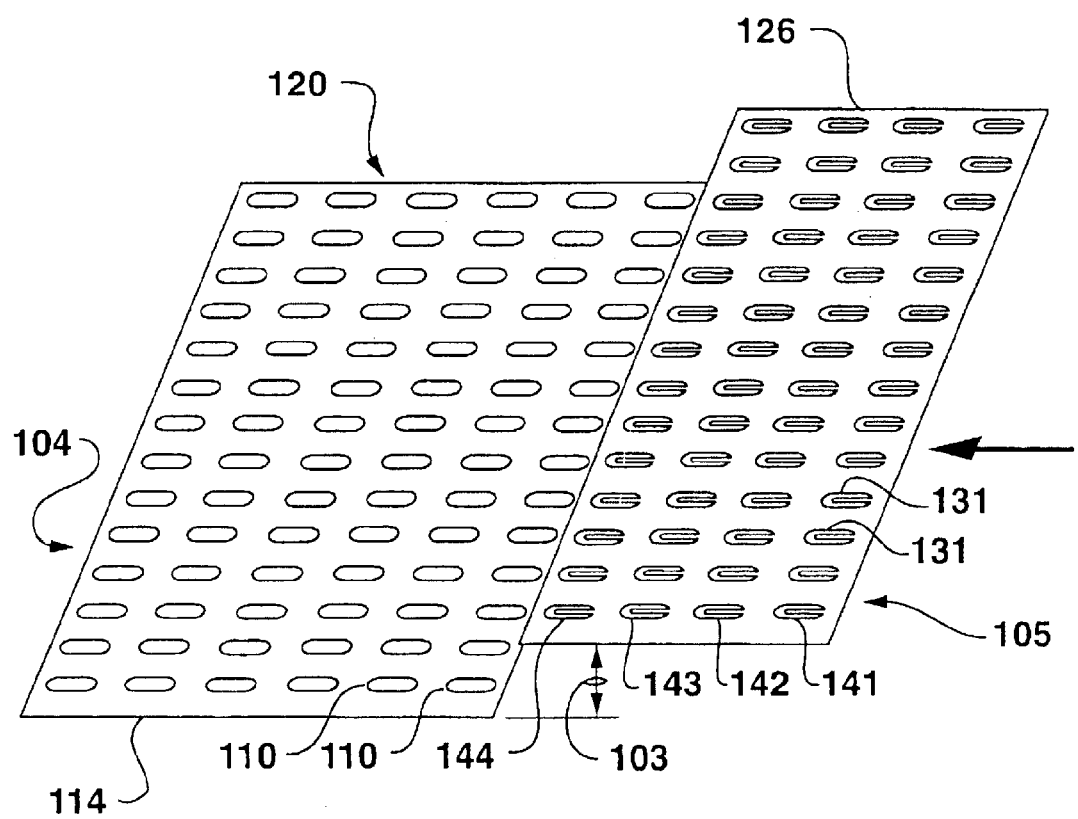
FIG. 6 is a schematic diagram of a memory device and an array of AFM tips according to one embodiment of the present invention.

For example, in the embodiment illustrated in FIG. 6, the different possible oligonucleotides written on the substrate can be any one of four different oligomers. In this embodiment, the substrate surface 114 can include a row 104 of memory cells 110, each of which can either be empty or can be filled with any one of the four different oligonucleotides. In a single row 105 on the reading array 126, there can thus be four arms 141, 142, 143, 144, each of which can recognize one of the four possible oligonucleotides. As the reading array 126 moves across the substrate 114 at a height 103, row 105 can be aligned with and move across row 104. As the reading array 126 is moved relative to the substrate surface 114, the oligonucleotides held in each memory cell in row 104 will come into proximity (generally about 3 angstroms or less) with the oligonucleotides held on each successive arm held in row 105. When the oligonucleotide held in a particular memory cell and the oligonucleotide held on a particular arm are complementary to each other, interaction forces between the complementary oligonucleotides can cause the cantilever arm to be deflected, the deflection can be registered and, as each arm of the reading array 126 can be assigned a value based upon the oligomer held on that arm, a value can be assigned to the corresponding cell at the address at which the arm was deflected. Thus, the value of each memory cell in row 104 can be identified according to its molecular content as the arms held in row 105 of reading array 126 pass over that cell.

The memory device of the present invention can also be erased by removal of the oligonucleotides held in particular cells. For example, in one embodiment the oligomer written on the device can include a linking compound at either end of the strand which can be the same or different. In this embodiment, the oligomer held in the memory cell can be physically pulled off of the surface by use of a compound which can attach to the free end of the oligomer with a stronger bond than the bond holding the oligomer to the surface.

In another possible embodiment, the device can be bathed in a solution of a suitable protease such as tripsin or protease K, for example, in order to completely remove the contents of all of the memory cells from the substrate surface. In this particular embodiment, a protease solution may remove not only the oligomers and linking compounds from the substrate surface, but also the anchoring compounds. As such, it may be necessary to recoat the substrate surface with an anchoring compound prior to again writing information on the surface of the device.

In yet another alternative embodiment, the substrate surface can be contacted with a material which can contain specific functionality to cleave the linking compound from the anchoring compound, while also preventing the linking compound from reattaching to the anchoring compound. For instance, in certain embodiments of the present invention, the nucleotide chain may be held to the substrate surface with a disulfide bond. In this embodiment, the disulfide bond may be broken in the presence of a reducing agent. For instance, a reducing agent such as mercaptoethanol can be caused to flow on to the substrate surface, and the disulfide bonds can be broken. In this embodiment, the oligomer and linking compound can be removed, and the anchoring compound can remain on the substrate surface to be utilized again in a writing process. If desired, the surface can additionally be rinsed to remove oligomers and linking compounds following the cleavage of the oligomers from the surface. Moreover, by utilizing microfluidic techniques, such as are generally known in the art, the cleaving material (i.e., the reducing agent in the case of a disulfide bond) can be particularly directed to individual memory cells, such that some cells on the substrate surface may be erased while other cells can remain with their contents intact.

Exemplary embodiments of the present invention are further directed to computer systems that include a memory device that can mimic the storage density capability of DNA and DNA-like polynucleotides. Such computer systems may include such features as a memory device and the associated hardware and/or circuitry to transfer information in and out of the device. An example of such a computer system and associated elements thereof is provided in the block diagram representation of FIG. 9.

Figure 9:
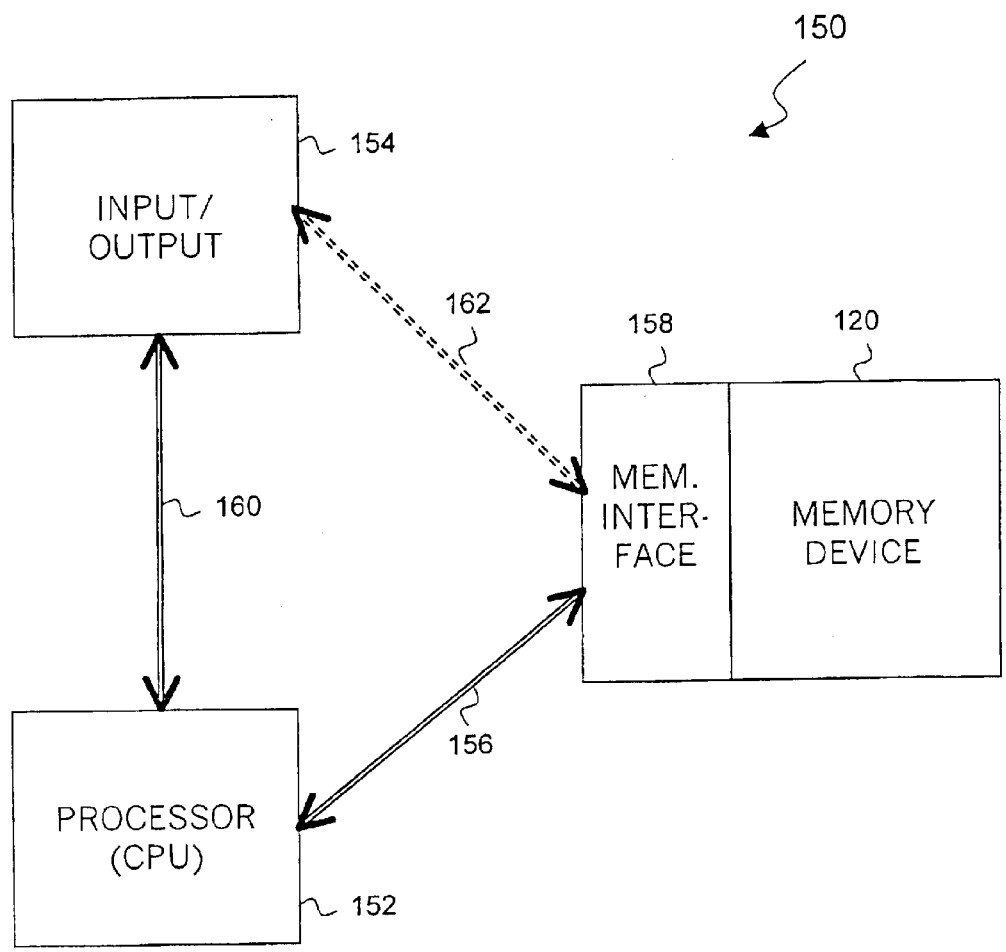
FIG. 9 is a block diagram of an exemplary computer system employing a memory device in accordance with one embodiment of the present invention.

Referring now to FIG. 9, three basic elements of a computer system 150 in accordance with such exemplary embodiment of the present invention include memory device 120, processor 152 and input/output (I/O) 154. Processor, or central processing unit, 152 is a fundamental component of any computer system, and may particularly correspond to any type of processor as readily known and available to one skilled in such related art. In general, a processor 152 includes selected of such exemplary elements as control circuits for fetching and executing instructions, an arithmetic logic unit for manipulating data, and registers for storing the processor status and some amounts of data. Processor 152 may also have interface circuits for controlling and communicating with the memory device 120 and the I/O subsystems (collectively depicted as 154.) The main memory of computer system 150 preferably includes a memory device 120 as illustrated and described with respect to FIG. 1. Such a memory device 120 includes a substrate having a surface thereof defining at least one memory cell at a predetermined memory cell address, or location on the substrate surface. In some embodiments, a plurality of memory cells, each cell located at a respective different memory cell address is provided as an array on the substrate surface of memory device 120. Each memory cell in memory device 120 may further include an anchoring compound attached to the substrate surface at the respective memory cell address(es). At least a portion of the memory cells may further include a linking compound attached to the anchoring compound and a polynucleotide, such as various oligonucleotides, attached to the linking compound. The polynucleotides provided in adjacent memory cells can be the same or different.

It should be appreciated that the main memory of computer 150 could also include other forms of memory in addition to the memory device 120. For instance memory device 120 may also include supplemental memory modules as conventionally available, such as electronic-based flash memory, EEPROM, RAM, ROM and other types of volatile or non-volatile memory, that may be used in combination with the molecular-based memory of the present invention.

As previously mentioned the main memory of exemplary computer system 150 provides storage for information such as instructions and data, and is coupled to the processor 152 via memory bus 156. Memory bus 156 may be any sort of physical hardwire or wireless communications medium connecting memory device 120 and processor 152. In some embodiments, memory bus 156 corresponds to a plurality of communications paths, such as a data bus, an address bus, and read and write lines, aspects of which are common knowledge to one of ordinary skill in the art of computer architecture and memory access. Such memory features are capable of affecting the reading and writing processes disclosed herein in accordance with the present invention. More particularly, memory device 120 and memory interface 158 are capable of performing "write" methodology by attaching polynucleotides to the substrate surface of memory device 120 and "read" methodology by identifying polynucleotides immobilized on such substrate surface.

Just as processor 152 may include some sort of interface to the memory bus 156 and other data transfer locations, the main memory of computer system 150 may also include a memory interface 158. Memory interface 158 may include an atomic force microscope (AFM) module 30 as illustrated herein and described with respect to FIG. 3. Such AFM components include a single AFM cantilever arm or an array of arms with respective AFM tips provided thereon. Additional control circuits may be provided in conjunction with the AFM features of memory interface 158 as hardware for implementing basic data protocol conversion between the molecular information stored in memory device 120 and the electronic data manipulation and instruction execution at processor 152.

Referring still to the exemplary computer system 150 of FIG. 9, the input/output (I/O) subsystem 154 contains peripheral devices that may be used for communicating with, observing, and controlling activity outside computer system 150. Peripheral devices may include without limitation such components as terminals, monitors, input features such as keyboards, mouse and touchpads, printers, communication devices, and various sensors and actuators. Such devices may be available to a user such that aspects of the memory reading and writing processes of the present invention may be facilitated. I/O subsystem 154 may also include mass storage devices used to store information not needed in the main memory at all times, such as applications programs and text files. Even this peripheral memory may in some embodiments correspond to memory device 120 in accordance with the present invention.

The processor 152 reads and writes information to and from the peripherals by means of I/O instructions that place commands and data on an I/O bus 160. In some embodiments, both memory and peripherals may share the same physical communications bus. In some embodiments of computer system 150, the processor 152 must read information from the peripheral devices at input/output 154 and store it in memory 120 and vice versa. In other embodiments, direct memory access via communication path 162 between the memory and peripherals is provided without the need for processor intervention.

Reference now will be made to various embodiments of the invention, one or more examples of which are set forth below. Each example is provided by way of explanation of the invention, not as a limitation of the invention. In fact, it will be apparent to those skilled in the-art that various modifications and variations may be made of this invention without departing from the scope or spirit of the invention.

EXAMPLE 1

A portion of a thin slide of mica was coated with a layer of biotin labeled bovine serum albumin, followed by a coating with streptavidin to provide a surface upon which to array biotin labeled oligonucleotides. Five oligonucleotides were utilized in order to construct a memory device, Biotin-5'AAAAAAAAAA3'-Fluorescein (oligoA), Biotin-5'GGGGGGGGGG3'-Fluorescein (oligoG), Biotin-5'CCCCCCCCCC3'-Fluorescein (oligoC), Biotin-5'TTTTTTTTTT3'-Fluorescein (oligoT) and Biotin-5'AAAAAAAAAGGGGGGGGGG3'-Fluorescein (oligoAG). The slide served as the bottom surface of an empty AFM fluid cell. Microdrops of approximately 100 nl of the five oligonucleotides in buffer solution were placed upon the cover slip, in a region not coated with streptavidin.

These microdrops served as a reference marker allowing re-positioning of each additional AFM tip as it was used. AFM silicon nitride pyramidal tips coated with biotin labeled bovine serum albumin, followed by a coating with streptavidin were utilized to construct the coding array on the cover slip. Initially, a streptavidin tip was dipped into the microdrop containing oligot such that the biotin-streptavidin interaction bound the oligoT tightly to the tip. The tip containing bound oligoT was then moved to the microdrop containing the oligoA resulting in binding of oligoA via helix formation between the oligot and the A region. The AFM tip thus loaded was then moved to an arbitrary position within the region of the cover slip coated with streptavidin and lowered to the surface until interaction between the biotin of the oligoA and the streptavidin on the surface was observed. When the tip was removed a "spot" of oligoA remained affixed to the streptavidin surface since the biotin-streptavidin binding, which held the oligo to the surface is significantly stronger than oligoT-oligoA binding that had held the oligomers to the tip.

Figure 7:
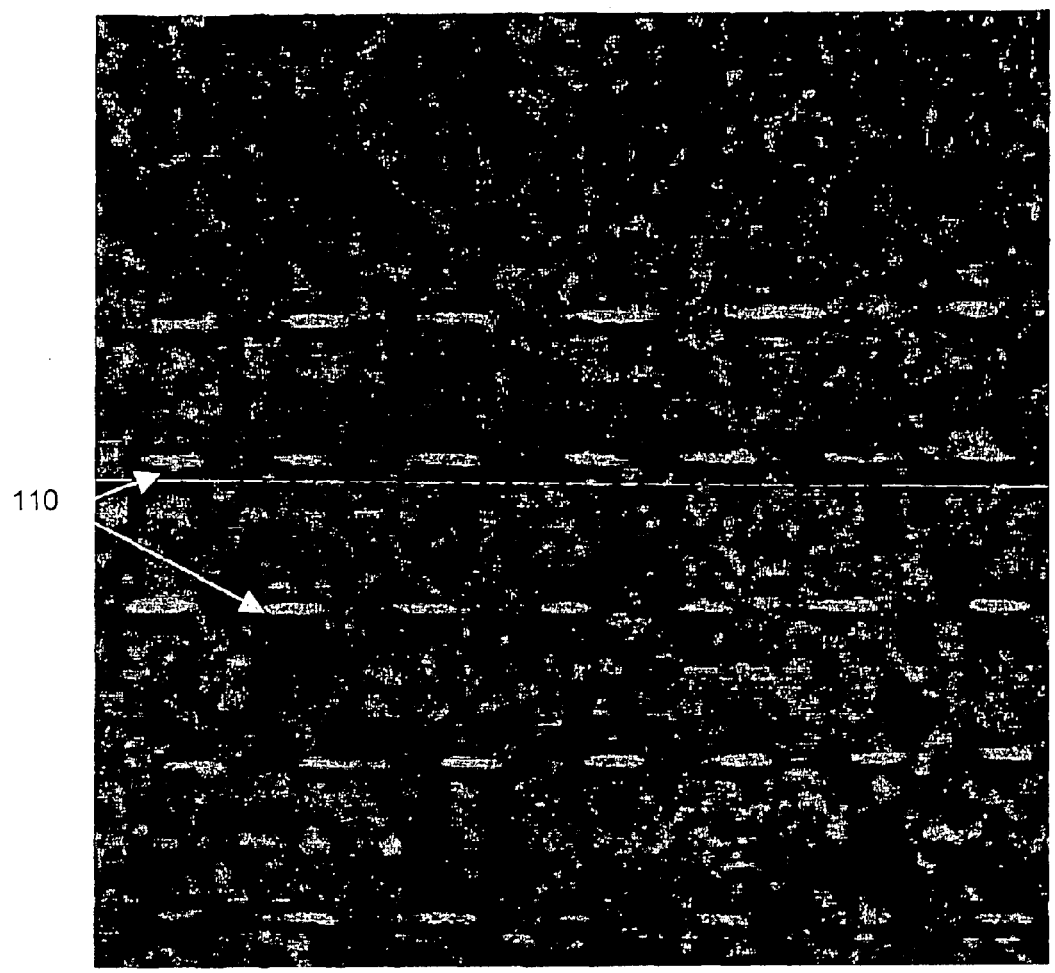
FIG. 7 is a photograph of an array of oligonucleotide-containing memory cells on a substrate surface.

DNA code was then written on the substrate within the AFM fluid cell. A new tip coated with streptavidin was dipped into the oligoC microdrop until the oligoC was firmly affixed to the tip surface. It was then dipped into the oligoG microdrop to allow binding of the oligoG. In order to re-orient operations with this tip, it was moved in a search pattern until aligning with the reference microdrops was observed through an optical microscope. Once re-orientation of the tip was accomplished the tip was moved to "dot" oligoG at desired positions on the chip array creating the G positions of the DNA chip. The same was then repeated using a new tip and "dotting" oligoC to create the C positions of the DNA chip. The A and T positions on the DNA chip were created using the same procedure. The array pattern of memory cells 110 may be seen in the fluorescence micrograph shown in FIG. 7, which is a 1.8 $\mu$m×1.8 $\mu$m micrograph

EXAMPLE 2

In this example, AFM was used to read the array of DNA code written in Example 1. Each of the four oligonucleotides oligo-A, oligo-G, oligo-C, and oligo-T, were affixed to an AFM tip and separately "dragged" along the linear stretches of the DNA chip array from Example 1. When oligo-A was so "dragged", discrete interaction forces between the tip bound oligo-A and any oligo-T cells on the substrate were measured by cantilever deflection measured by AFM, providing evidence for the position of each T spot within the DNA chip array. Similar operations using the tips bearing oligo-G, oligo-T and oligo-C indicated the positions of the other three positions of the DNA chip array.

Figure 8:
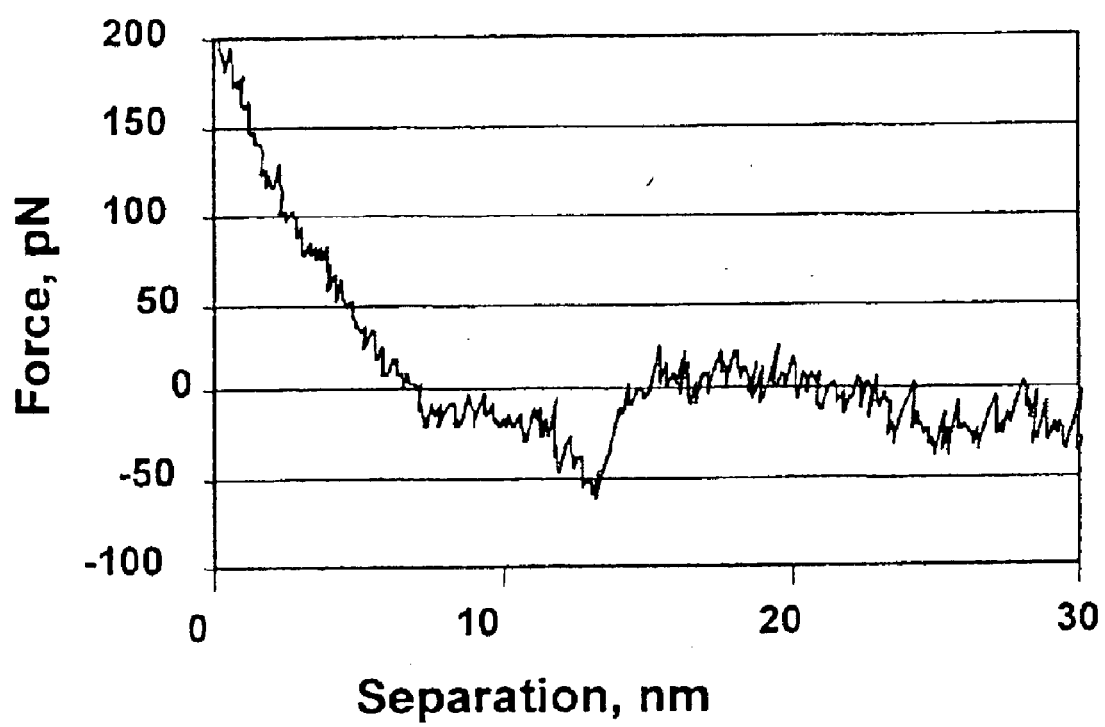
FIG. 8 shows the recorded AFM cantilever deflection curves obtained in a reading process.

FIG. 8 shows the recorded AFM cantilever deflection curve shown as a function of force as the AFM arm was moved across the substrate and recognized the DNA code written on the chip. As the AFM tip passed over the memory cell which held the complementary DNA strand (between about 12 and about 15 nm on the Figure), the arm was deflected toward the substrate surface (with a maximum force of about −50 pN) due to the interaction force between the two complementary strands, one on the AFM tip, and the other immobilized on the substrate surface.

It will be appreciated that the foregoing examples, given for purposes of illustration, are not to be construed as limiting the scope of this invention. Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention which is defined in the following claims and all equivalents thereto. Further, it is identified that many embodiments may be conceived that do not achieve all of the advantages of some embodiments, yet the absence of a particular advantage shall not be construed to necessarily mean that such an embodiment is outside the scope of the present invention.

What is claimed is:

1. A memory device comprising:
    a substrate comprising a surface;
    a plurality of memory cells defined on the substrate surface, wherein each memory cell is located at a different memory cell address on the substrate surface;
    an anchoring compound attached to the surface at each memory cell address;
    a linking compound attached to the anchoring compound in at least a portion of the memory cells; and
    an oligonucleotide selected from the group consisting of oligo-A oligomers, oligo-T oligomers, oligo-C oligomers, and oligo-G oligomers attached to the linking compound in at least a portion of the memory cells containing the linking compound, wherein the oligonucleotide held in adjacent memory cells can be the same or different.

2. The memory device of claim 1, wherein the oligonucleotide comprises less than about 50 monomer units.

3. The memory device of claim 2, wherein the oligonucleotide comprises between about 5 and about 20 monomer units.

4. The memory device of claim 2, wherein the oligonucleotide comprises about 10 monomer units.

5. The memory device of claim 1, wherein each memory cell is at a distance of less than about 500 nm from any adjacent memory cell.

6. The memory device of claim 1, wherein each memory cell is at a distance of less than about 200 nm from any adjacent memory cell.

7. The memory device of claim 1, wherein the substrate surface comprises a material selected from the group consisting of glass, mica, silicone, and metal.

8. The memory device of claim 1, wherein the anchoring compound is a protein.

9. The memory device of claim 8, wherein the protein is streptavidin.

10. The memory device of claim 1, wherein the anchoring compound is an antibody.

11. The memory device of claim 1, wherein the memory device is in communication with an atomic force microscope arm.

12. The memory device of claim 1, wherein the memory device is in communication with an array of atomic force microscope arms.

13. A memory device comprising:
    a substrate comprising a surface;
    a plurality of memory cells, each memory cell defined at a different memory cell address on the surface; and
    at least one oligonucleotide selected from the group consisting of oligo-A oligomers, oligo-T oligomers, oligo-C oligomers, and oligo-G oligomers attached to the surface at the memory cell address of at least a portion of the memory cells, wherein the oligonucleotides in adjacent memory cells can be the same or different.

14. The memory device of claim 13, wherein the oligonucleotides comprise between about 5 and about 20 monomer units.

15. The memory device of claim 14, wherein the oligonucleotides comprise about 10 monomer units.

16. The memory device of claim 13, wherein each memory cell is at a distance of less than about 500 nm from any adjacent memory cell.

17. The memory device of claim 13, wherein each memory cell is at a distance of less than about 200 nm from any adjacent memory cell.

18. The memory device of claim 13, wherein the substrate surface comprises a material selected from the group consisting of glass, mica, silicone, and metal.

19. The memory device of claim 13, wherein the oligonucleotides are attached to the surface with a dual binding system comprising an anchoring compound attached to the surface and a linking compound attached to both the oligonucleotide and the anchoring compound.

20. The memory device of claim 19, wherein the anchoring compound is streptavidin and the linking compound is biotin.

21. The memory device of claim 19, wherein the anchoring compound is an antibody and the linking compound is a hapten.

22. The memory device of claim 13, wherein the memory device is in communication with an atomic force microscope arm.

23. The memory device of claim 13, wherein the memory device is in communication with an array of atomic force microscope arms.

* * * * *